United States Patent
Jung et al.

(10) Patent No.: US 9,601,218 B2
(45) Date of Patent: Mar. 21, 2017

(54) MEMORY DEVICE AND COMPUTING SYSTEM INCLUDING THE SAME

(71) Applicant: Samsung Electronics Co., Ltd., Suwon-Si, Gyeonggi-Do (KR)

(72) Inventors: Bu-Il Jung, Hwaseong-si (KR); Ju-Yun Jung, Hwaseong-si (KR); Do-Geun Kim, Seoul (KR); Dong-Yang Lee, Yongin-si (KR); Min-Yeab Choo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 101 days.

(21) Appl. No.: 14/530,951

(22) Filed: Nov. 3, 2014

(65) Prior Publication Data

US 2015/0169333 A1 Jun. 18, 2015

(30) Foreign Application Priority Data

Dec. 12, 2013 (KR) .................. 10-2013-0154622

(51) Int. Cl.
*G11C 29/00* (2006.01)
*G11C 29/44* (2006.01)
*G06F 9/44* (2006.01)
*G11C 29/04* (2006.01)

(52) U.S. Cl.
CPC ............ *G11C 29/44* (2013.01); *G06F 9/4401* (2013.01); *G11C 2029/0407* (2013.01); *G11C 2029/4402* (2013.01)

(58) Field of Classification Search
CPC ............... G06F 9/4401; G06F 11/1417; G06F 11/0787; G11C 29/44; G11C 2029/0407; G11C 2029/4402

USPC ....... 714/710, 711, 723, 718, 733, 6.1, 6.11, 714/6.12, 6.13, 6.32, 42; 711/200, 202, 711/203, 205, 206, 207, 221; 713/300, 713/340
See application file for complete search history.

(56) References Cited

U.S. PATENT DOCUMENTS

| | | |
|---|---|---|
| 6,240,525 B1 | 5/2001 | Chiang |
| 6,762,965 B2 | 7/2004 | Benedix et al. |
| 6,792,500 B1 | 9/2004 | Herbst |
| 6,829,722 B2 | 12/2004 | Lin |
| 7,114,024 B2 | 9/2006 | Herbst |
| 7,430,145 B2 | 9/2008 | Weiss et al. |
| 7,694,195 B2 | 4/2010 | Khatri et al. |

(Continued)

FOREIGN PATENT DOCUMENTS

KR 19990032660 A 5/1999

*Primary Examiner* — Christine Tu
(74) *Attorney, Agent, or Firm* — Harness, Dickey & Pierce, P.L.C.

(57) ABSTRACT

A memory system includes a read-only memory (ROM), a main memory and a processor. The ROM stores a basic input/output system (BIOS). The main memory includes a fail address table which stores at least one fail address designating a memory cell row having at least one defective cell. The processor receives fail information of the at least one fail address from the main memory and loads data associated with a booting operation of the memory system in a safe area of the main memory by avoiding a fail area corresponding to the at least one fail address during power-on operation while a power is applied to the memory system. The data associated with the booting operation is stored in a storage device.

18 Claims, 18 Drawing Sheets

(56) References Cited

U.S. PATENT DOCUMENTS

| | | | |
|---|---|---|---|
| 7,941,705 B2 | 5/2011 | Han | |
| 7,984,329 B2 | 7/2011 | Lastras-Montano et al. | |
| 8,055,948 B2 * | 11/2011 | Pierce | G06F 9/4406 |
| | | | 713/2 |
| 8,140,836 B2 * | 3/2012 | Ogawa | G06F 11/1417 |
| | | | 710/316 |
| 8,276,029 B2 | 9/2012 | Khatri et al. | |
| 8,446,787 B2 | 5/2013 | Sarin et al. | |
| 2009/0049257 A1 | 2/2009 | Khatri et al. | |
| 2009/0240934 A1 * | 9/2009 | Chou | G06F 11/1417 |
| | | | 713/2 |
| 2011/0125982 A1 | 5/2011 | Choi et al. | |
| 2013/0051123 A1 | 2/2013 | Lee et al. | |
| 2013/0055048 A1 | 2/2013 | Yu et al. | |
| 2014/0095948 A1 * | 4/2014 | Kochar | G11C 29/56 |
| | | | 714/718 |

* cited by examiner

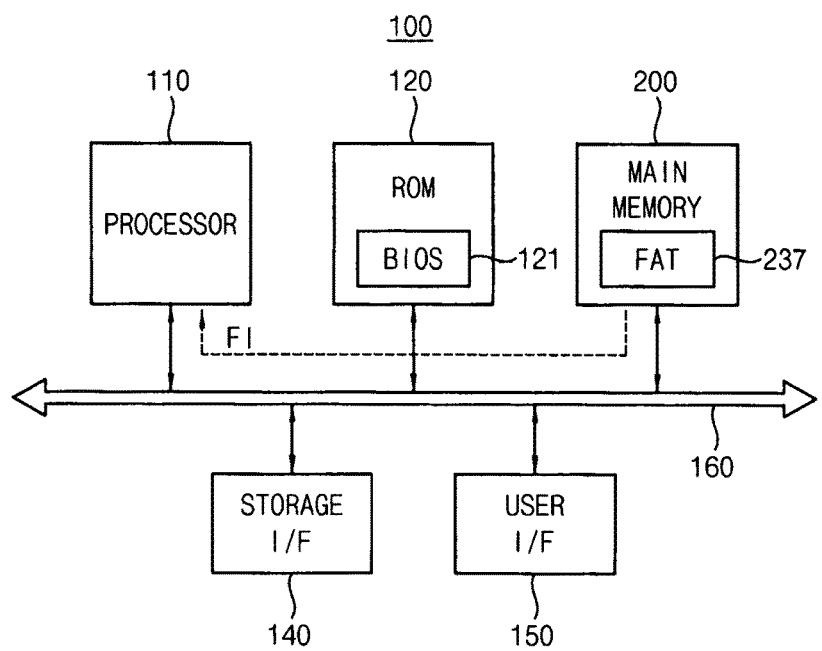
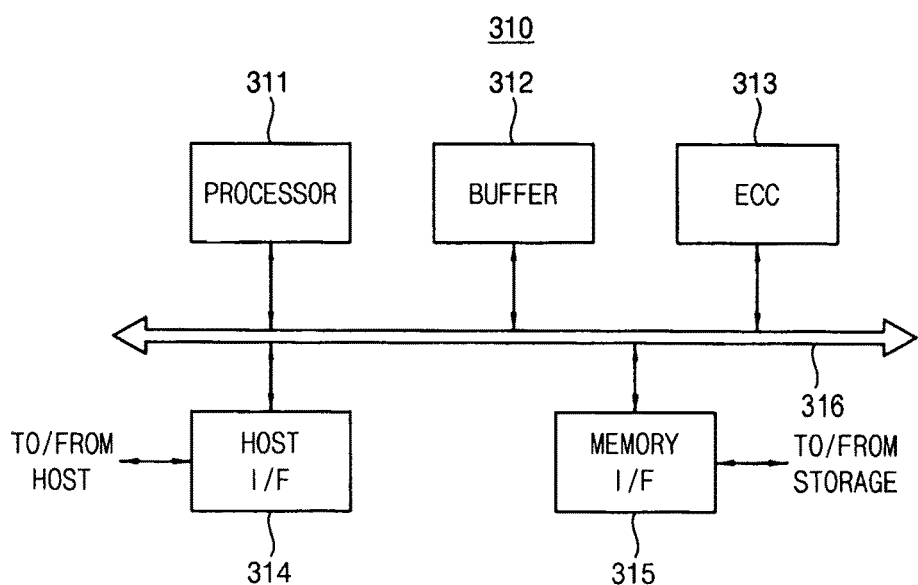

US 9,601,218 B2

MEMORY DEVICE AND COMPUTING SYSTEM INCLUDING THE SAME

CROSS-REFERENCE TO RELATED APPLICATION

This application claims priority under 35 USC §119 to Korean Patent Application No. 10-2013-0154622, filed on Dec. 12, 2013, in the Korean Intellectual Property Office (KIPO), the content of which is herein incorporated by reference in its entirety.

BACKGROUND

1. Technical Field

Example embodiments relate to a memory device and a computing system including the same.

2. Description of the Related Art

In general, a memory system includes a memory device for storing data and a host for controlling operations of the memory device. The memory device may be classified into a volatile memory (such as dynamic random-access memory (DRAM), static random-access memory (SRAM), etc.) and a non-volatile memory (such as electrically erasable programmable random-access memory (EEPROM), ferroelectric random-access memory (FRAM), Phase-change RAM (PRAM), Magnetoresistive random-access memory (MRAM), flash memory, etc.).

The volatile memory may lose its stored data when power supply is cut off, while the non-volatile memory may retain its stored data even when there is no power supply. Among non-volatile memories, the flash memory is widely used as a data storage medium because of advantages such as a high programming speed, lower power consumption, and high capacity data storage.

Recently, a semiconductor disk device using the semiconductor memory devices has been developed. The semiconductor disk device may have a better speed and reliability than a hard disk that uses a rotation type disk. Therefore, computing systems are being developed, which use the semiconductor disk device as a storage device instead of a hard disk storage device.

SUMMARY

Some example embodiments provide a memory system, capable of supporting secure booting operation.

Some example embodiments provide a computing system that includes the memory system, capable of supporting secure booting operation.

According to some example embodiments, a memory system includes a read-only memory (ROM), a main memory and a processor. The ROM stores a basic input/output system (BIOS). The main memory includes a fail address table which stores at least one fail address designating a memory cell row having at least one defective cell. The processor receives fail information of the at least one fail address from the main memory and loads data associated with a booting operation of the memory system in a safe area of the main memory by avoiding a fail area corresponding to the at least one fail address during power-on operation while a power is applied to the memory system. The data associated with the booting operation is stored in a storage device.

In some example embodiments, when the power is applied to the memory system, the BIOS is loaded to the main memory from the ROM, the loaded BIOS is executed by the processor and the executed BIOS performs an initializing operation of the memory system.

The data associated with the booting operation may include at least a boot image that is stored in the storage device, and the BIOS may designate locations in the safe area, to which the boot image and the fail information are to be loaded by referring to the fail information.

The processor may include a fail information register that stores the fail information.

After the boot image is loaded in the safe area from the storage device, the processor may load the fail information to the locations in the safe area, and the locations may be designated by the BIOS.

The processor may assign the fail information to addresses of the safe area such that the fail information does not overlap with the boot image in the safe area.

The processor may execute the boot image loaded in the safe area as a boot loader, and the boot loader may load an operating system stored in the storage device to the safe area by referring to the fail information.

The processor may assign the operating system to the addresses of the safe area such that the operating system does not overlap with the boot loader and the fail information in the safe area.

The processor may execute the operating system loaded in the safe area, and the executed operating system may load an application program stored in the storage device to the safe area by referring to the fail information. The operating system may assign the application program to the addresses of the safe area such that the application program does not overlap with the fail information and the OS in the safe area.

The BIOS may perform power-on self-test (POST) on the main memory and the storage device.

In some example embodiments, the fail address table may be non-volatile and the fail information is provided to the processor through a data pin of the main memory.

In some example embodiments, the processor may adaptively load the data associated with booting operation to the safe area of the main memory such that the data associated with booting operation has consecutive addresses or non-consecutive addresses according to the fail information.

In some example embodiments, the at least one fail address may be stored in the fail address table after memory cells of the main memory are tested at a wafer level or a package level of the memory system.

According to some example embodiments, a computing system includes a storage device and a memory system. The storage device include a storage that stores at least a boot image, an operating system and an application program. The memory system controls the storage device. The memory system includes a read-only memory (ROM), a main memory and a processor. The ROM stores a basic input/output system (BIOS). The main memory includes a fail address table which stores at least one fail address designating a memory cell row having at least one defective cell. The processor receives fail information of the at least one fail address from the main memory and loads data associated with a booting operation of the memory system in a safe area of the main memory by avoiding a fail area corresponding to the at least one fail address during power-on operation while a power is applied to the computing system. The data associated with the booting operation is stored in the storage device.

Accordingly, according to example embodiments, the fail information on the fail addresses of the main memory is provided to the processor during a power-on sequence when the power is supplied to the computing system, and the processor loads the boot image, the operating system and the application programs stored in storage to a safe area of the main memory by avoiding the fail areas designated by the fail addresses when processor loads the boot image, the operating system and the application programs to the memory cell array of the main memory. Therefore, secure booting of the computing system may be performed.

In some example embodiments, the memory device includes a memory cell array; and a processor configured to load machine executable code to one or more safe areas of the memory cell array based on fail information.

In some example embodiments, the processor is configured to, acquire the fail information from a fail address table stored in the memory cell array, the fail information containing physical addresses of the memory cell array that are weak or damaged, and adaptively load the machine executable code to the one or more safe areas of the main memory such that the machine executable code is loaded in memory cells having consecutive or non-consecutive addresses according to the fail information.

In some example embodiments, the memory cell array is configured to have the fail address table loaded with the fail information during fabrication of the memory device. [26] In some example embodiments, the memory device further includes a read-only memory (ROM) configured to store a system Basic Input/Output System (BIOS) therein, wherein the processor is configured to load the BIOS from the ROM to one or more of the safe areas of the memory cell array based on the fail information when the memory device is initialized, and the BIOS is configured to perform a power-on self-test (POST) on the memory device and a storage device when the memory device is initialized.

In some example embodiments, the machine executable code is associated with one or more of a boot image, an operation system, and an application loaded during initialization of the memory device, and when loading the machine executable code during the initialization of the memory device, the processor is configured to load the machine executable code to memory cells of the safe area having logical addresses that are loaded in logically distinct ones of the safe areas.

BRIEF DESCRIPTION OF THE DRAWINGS

Illustrative, non-limiting example embodiments will be more clearly understood from the following detailed description taken in conjunction with the accompanying drawings.

FIG. 2 is a block diagram illustrating the host device in FIG. 1 according to some example embodiments.

FIG. 3 is a block diagram illustrating an example of the storage controller in FIG. 1 according to some example embodiments.

DETAILED DESCRIPTION OF EXAMPLE EMBODIMENTS

Figure 1:
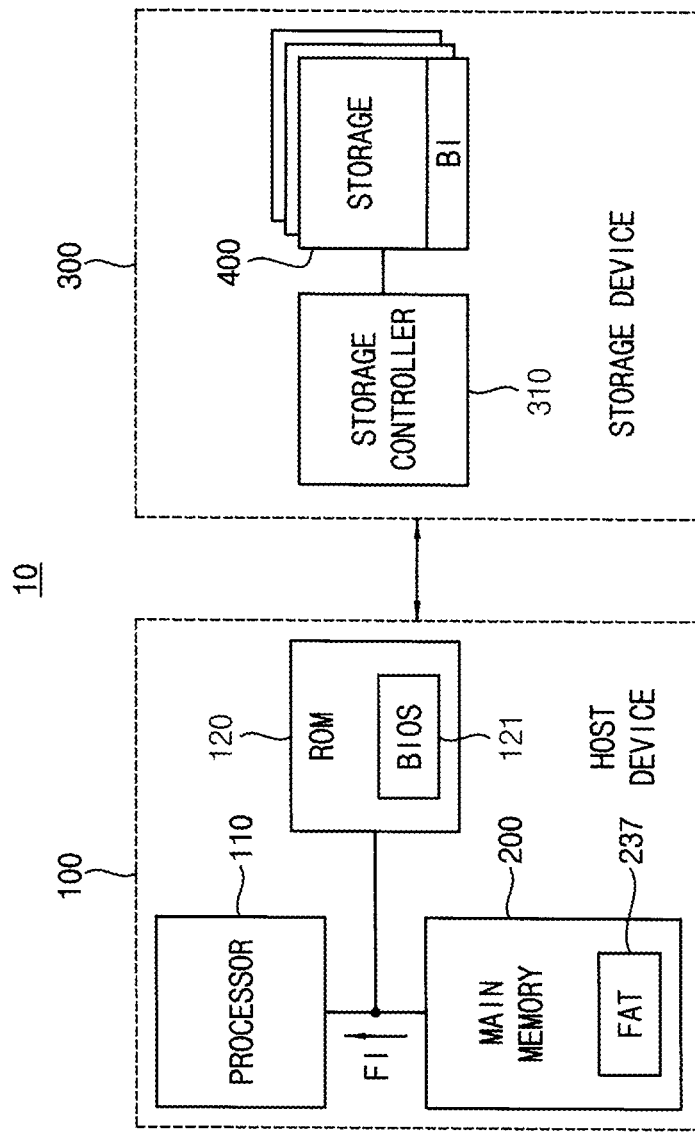
FIG. 1 is a block diagram illustrating a computing system according to some example embodiments.

Various example embodiments of the inventive concepts will now be described with reference to the accompanying drawings. Example embodiments of the inventive concepts may, however, be embodied in many different forms and should not be construed as being limited to only the illustrated embodiments. Rather, these example embodiments are provided so that this disclosure will be thorough and complete and will fully convey the scope of the example embodiments of the inventive concepts to those skilled in the art. Throughout the written description and drawings, like reference numbers refer to like or similar elements and features.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the example embodiments of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments and is not intended to be limiting of example embodiments of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described with reference to accompanying drawings. The same reference numerals will be used to refer to the same elements throughout the drawings and detailed description about the same elements will be omitted in order to avoid redundancy.

FIG. 1 is a block diagram illustrating a computing system according to some example embodiments.

Referring to FIG. 1, a computing system 10 may include a host device 100 and a storage device 200.

The host device 100 may include a processor 110, a read-only memory (ROM) 120 and a main memory 200. The host device 100 may be referred to as a memory system because the host device 100 includes the processor 110 and the main memory 130 which is controlled by the processor 110. The ROM 120 stores a basic input/output system (BIOS) 121, and the main memory 200 may store a fail address table 237.

The processor 110 may control overall operation of the host device 100. The processor 110 may be coupled to the main memory 200 and the ROM 120 through a system bus (e.g., an address bus, a control bus and/or a data bus). For example, in some example embodiments, the main memory 200 may be implemented by a dynamic random access memory (DRAM). In other example embodiments, the main memory 200 may be implemented by a static random access memory (SRAM), a flash memory, a mobile DRAM, a phase random access memory (PRAM), a ferroelectric random access memory (FRAM), a resistive random access memory (RRAM), a magnetic random access memory (MRAM), etc. When the power is applied to the computing system 10, the main memory 200 may be configured to provide the processor 110 with fail information FI that specifies fail areas of the main memory 20 and the processor 110 may load programs to safe areas in the main memory 200 by avoiding the fail areas when the programs are loaded from the storage device 300. The fail areas may include one or more fail addresses of at least one memory cell row which includes at least defective cells in the main memory 20.

The BIOS 121 stored in the ROM 120 controls the computing system 10 when the power is supplied to the computing system 10.

The storage device 300 may include a storage controller 310 and a nonvolatile storage 400. The nonvolatile storage 400 may be implemented with a nonvolatile memory device such as a flash memory device, however, example embodiments are not limited thereto. The storage 400 may store at least a boot image BI which is associated with a booting operation of the computing system 10 performed, at least during a power-up sequence when the power is supplied thereto.

The storage 400 may store data provided from the host device 100 and/or may provide the host device 100 with stored data. The storage 400 maintains data when power supply is cut-off. The storage 400 may be implemented by NAND flash memory, NOR flash memory, PRAM, FRAM, RRAM, MRAM, etc.

FIG. 2 is a block diagram illustrating the host device in FIG. 1 according to some example embodiments.

Referring to FIG. 2, the host device 100 includes the processor 110, the ROM 120, the main memory 200, a storage interface 140, a user interface 150 and a bus 160.

The bus 160 may refer to a transmission channel via which data is transmitted between the processor 110, the ROM 120, the main memory 200, the storage interface 140 and the user interface 150 of the host device 100.

The ROM stores the BIOS 121. The BIOS 121 is loaded to the main memory 200 and is executed by the processor 110 to perform initializing operation of the computing system 10 during booting when the power is first supplied to the computing system 10. In addition, the ROM 120 may store various application programs. For example, application programs supporting storage protocols such as Advanced Technology Attachment (ATA), Small Computer System Interface (SCSI), embedded Multi Media Card (eMMC), and Unix File System (UFS) protocols may be stored in the ROM 120.

The main memory 200 may store a fail address table 237 therein. The fail address table 237 may contain at least one fail address designating at least one memory cell row that includes at least one defective memory cell in the main memory 200. In addition, data, programs, a boot image, and/or an operating system stored in the storage device 300 may be loaded to the main memory 200 for temporary storage therein.

The storage interface 140 may include an interface supporting a storage protocol, e.g., an Advanced Technology Attachment (ATA) interface, a Serial Advanced Technology Attachment (SATA) interface, a Parallel Advanced Technology Attachment (PATA) interface, a Universal Serial Bus (USB) or Serial Attached Small Computer System (SAS) interface, a Small Computer System Interface (SCSI), an embedded Multi Media Card (eMMC) interface, or a Unix File System (UFS) interface.

The user interface 150 may be a physical or virtual medium for exchanging information between a user and the host device 100. For example, the user interface 150 may be a computer program, etc., and include physical hardware and/or logical software. For example, the user interface 150 may include an input device for allowing the user to manipulate the host device 100, and an output device for outputting a result of processing an input of the user.

The processor 110 may control overall operations of the host device 100. The processor 110 may generate a command (or a request) for storing data in the storage device 300 and/or reading data from the storage device 300 by using an application stored in the ROM 120, and transmit the command (or request) to the storage device 300 via the storage interface 140. In addition, when the power is applied to the computing system 10 (e.g. during a booting operation), the processor 110 receives the fail information FI from the main memory 200 and loads programs to safe areas in the main memory 200 such that the processor 110 avoids fail areas in the main memory 200 when the programs are loaded from the storage device 300 based on the fail information FI.

FIG. 3 is a block diagram illustrating an example of the storage controller in FIG. 1 according to some example embodiments.

Referring to FIG. 3, the storage controller 310 may include a processor 311, a buffer 312, an error check and correction (ECC) block 313, a host interface 314, a memory interface 315, and a bus 316.

The bus 316 may refer to a transmission channel via which data is transmitted between the processor 311, the buffer 312, the ECC block 313, the host interface 314 and the memory interface 315 of the storage controller 310. The processor 311 may perform operations for exchanging data between the host device 100 and the storage 400.

The host interface 314 may include a protocol for exchanging data with the host device 100 that accesses the storage device 300, and connect the storage device 300 to the host device 100. The host interface 314 may be implemented using an Advanced Technology Attachment (ATA) interface, a Serial Advanced Technology Attachment (SATA) interface, a Parallel Advanced Technology Attachment (PATA) interface, a Universal Serial Bus (USB) or Serial Attached Small Computer System (SAS) interface, a Small Computer System Interface (SCSI), an embedded Multi Media Card (eMMC) interface, or a Unix File System (UFS) interface, however, example embodiments are not limited thereto. The processor 311 may communicate with the storage 400 through the memory interface 315.

The ECC block 313 may generate an error correction code (ECC) for data which is received from the host device 100 using an algorithm such as a Reed-Solomon (RS) code, a Hamming code, or a cyclic redundancy code (CRC) during a write operation. During a read operation, the ECC block 313 may perform error detection and error correction on data read from the storage 400 using the ECC read together with the data.

In some example embodiments, the storage controller 310 may be built in the storage 400. In other example embodiments, the storage controller 310 and the storage 400 may be fabricated as separate chips. The ECC block 313 may be included in the storage 400 for reducing amount of data transmission between the storage 400 and the storage controller 310.

The buffer 312 may temporarily store data from the host device 100 or data from the storage 400. In addition, the buffer 312 may temporarily store data, the boot image BI, OS and application programs and may provide the data, the boot image BI, OS and application programs to the host device 100.

The storage device 300 may be implemented by a memory card or a solid state drive, etc. The storage device 300 and/or the storage 400 and the storage controller 310 therein may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 4:
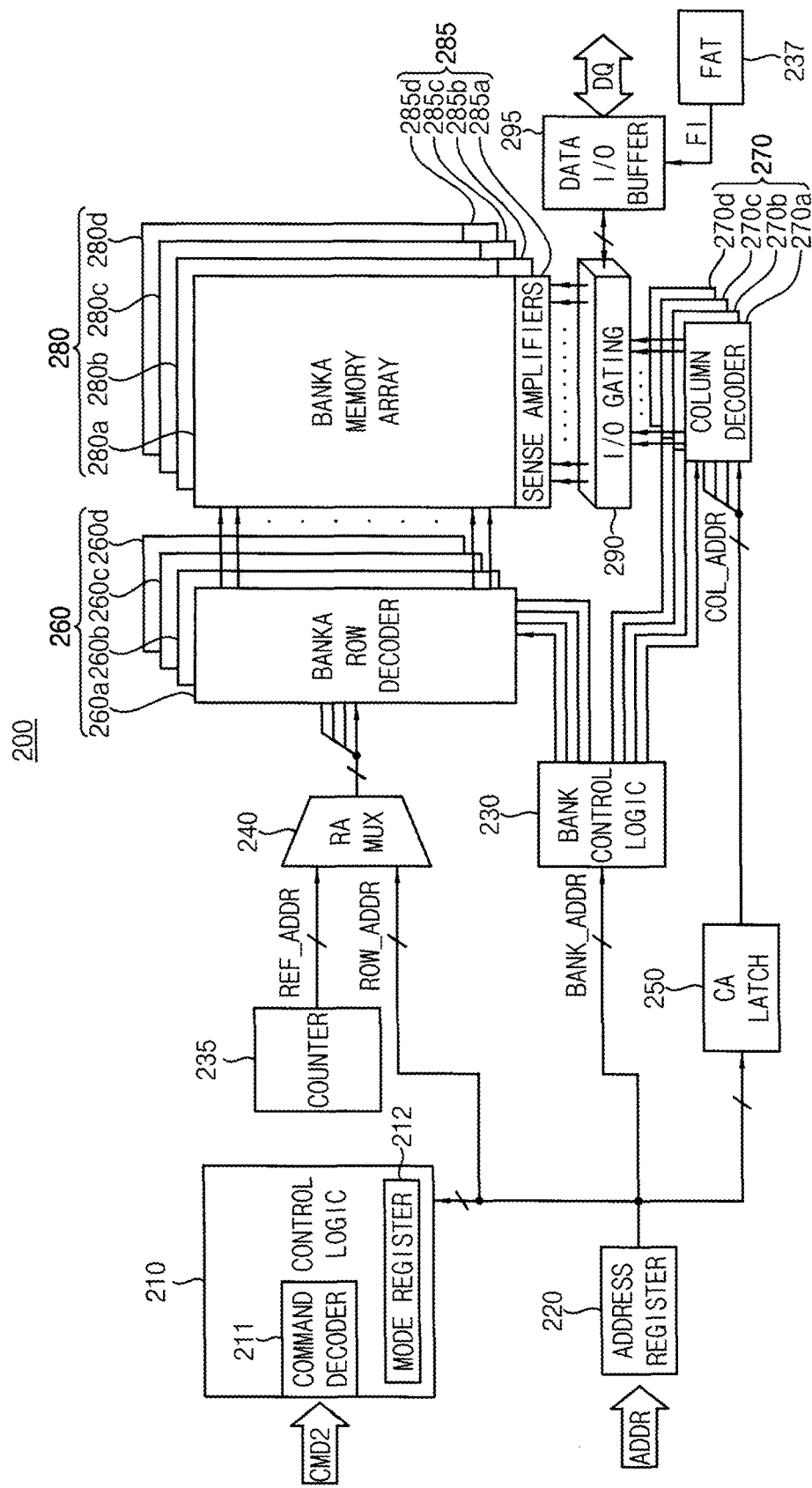
FIG. 4 is a block diagram illustrating an example of the main memory in FIG. 1 according to some example embodiments.

FIG. 4 is a block diagram illustrating an example of the main memory in FIG. 1 according to some example embodiments.

In FIG. 4, it is assumed that the main memory 200 is implemented with a DRAM, however, example embodiments are not limited thereto.

Referring to FIG. 4, the main memory 200 may include a control logic 210, an address register 220, a bank control logic 230, a row address (RA) multiplexer 240, a refresh counter 235, a fail address table 237, a column address (CA) latch 250, a row decoder 260, a column decoder 270, a memory cell array 280, a sense amplifier unit 285, an input/output (I/O) gating circuit 290 and a data input/output (I/O) buffer 295. In some example embodiments, the memory device 201 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), or a Rambus dynamic random access memory (RDRAM), however, example embodiments are not limited thereto.

The memory cell array 280 may include first through fourth bank arrays 280a, 280b, 280c and 280d. The row decoder 260 may include first through fourth bank row decoders 260a, 260b, 260c and 260d respectively coupled to the first through fourth bank arrays 280a, 280b, 280c and 280d, the column decoder 270 may include first through fourth bank column decoders 270a, 270b, 270c and 270d respectively coupled to the first through fourth bank arrays 280a, 280b, 280c and 280d, and the sense amplifier unit 285 may include first through fourth bank sense amplifiers 285a, 285b, 285c and 285d respectively coupled to the first through fourth bank arrays 280a, 280b, 280c and 280d. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although the main memory 200 is illustrated in FIG. 4 as including four banks, the main memory 200 may include a different number of banks.

The address register 220 may receive an address ADDR including a bank address BANK_ADDR, a row address ROW_ADDR and a column address COL_ADDR from a memory controller (not illustrated). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh row address REF_ADDR from the refresh counter 235. The row address multiplexer 240 may selectively output the row address ROW_ADDR or the refresh row address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a word line corresponding to the row address. For example, the activated bank row decoder may apply a word line driving voltage to the word line corresponding to the row address.

The column address latch 250 may receive the column address COL_ADDR from the address register 220, and may temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the input/output gating circuit 290 to output data corresponding to the column address COL_ADDR.

The input/output gating circuit 290 may include circuitry for gating input/output data. The input/output gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data input/output buffer 295 Likewise, data DQ to be written to one bank array of the first through fourth bank arrays 280a, 280b, 280c and 280d may be provided from the memory controller to the data input/output buffer 295. The data DQ provided to the data input/output buffer 295 may be written to the one array bank via the write drivers.

The control logic 210 may control operations of the main memory 200. For example, the control logic 210 may generate control signals for the main memory 200 to perform a write operation or a read operation. The control logic 210 may include a command decoder 211 that decodes a command CMD received from the memory controller and a mode register 212 that sets an operation mode of the memory device 201. For example, the command decoder 211 may generate the control signals corresponding to the command CMD by decoding a write enable signal (/WE), a row address strobe signal (/RAS), a column address strobe signal (CAS), a chip select signal (CS), etc. The command decoder 211 may further receive a clock signal (CLK) and a clock enable signal (CKE) for operating the memory device 201 in a synchronous manner.

The fail address table 237 stores fail addresses corresponds to addresses of defective cells or weak cells in the memory cell array 280 and may provide the processor 110 in FIG. 1 with the fail addresses of fail areas via the fail information FI. The processor 110 may be provided the fail information FI from the fail address table 237 through the data I/O buffer 295 and a data pin of the main memory 200 during at least a power-up sequence when the power is supplied to the computing system 10. The processor 110 may assign addresses of the memory cell array 280 such that the boot image BI, the OS and the application programs stored in the storage device 310 may be loaded to the safe areas in the memory cell array 280 by avoiding the fail areas designated by the fail addresses based on the fail information FI. The fail address table 237 may be nonvolatile. For example, the fail address table 237 may be implemented with a programmable ROM, an electrically-erasable programmable ROM (EEPROM) or a flash memory device and at least one fail address may be stored as the fail information FI in the fail address table 237 by programming the a programmable ROM, electrically-erasable programmable ROM or the EEPROM or the flash memory device.

Figure 5:
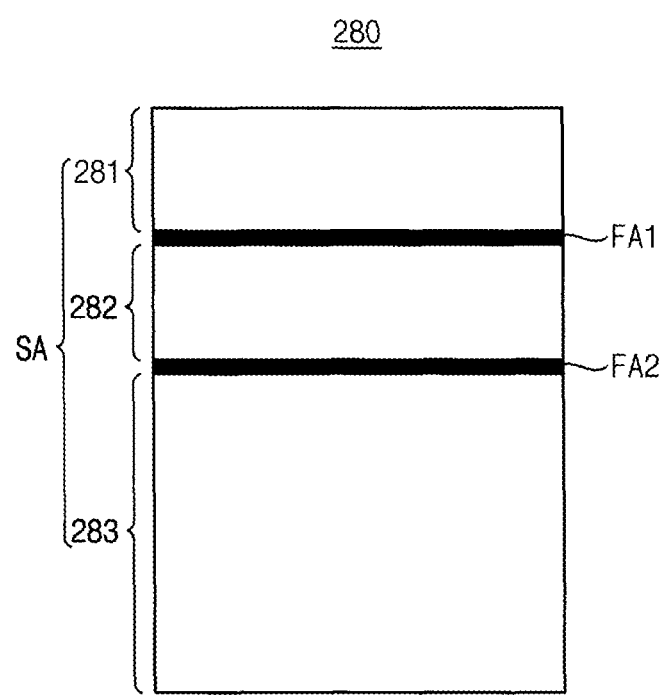
FIG. 5 illustrates the memory cell array in FIG. 4 according to some example embodiments.

FIG. 5 illustrates the memory cell array in FIG. 4 according to some example embodiments.

Referring to FIGS. 4 and 5, the memory cell array 280 may include fail areas designated by first and second fail addresses FA1 and FA2 and safe areas SA including areas 281, 282 and 283, which may be areas of the memory cell array 280 other than the fail areas.

The processor 110 may assign addresses of the memory cell array 280 such that the boot image BI, the operating system OS and the application programs stored in the storage device 310 may be loaded to the safe areas SA in the memory cell array 280 by avoiding the fail areas designated by the fail addresses FA1 and FA2 based on the fail information FI.

In a manufacturing process of the computing system 10, testing may be performed on memory cells included in the memory cell array 280 at a wafer level or a package level. During the testing, the fail areas, for example, fail areas designated by the fail addresses FA1 and FA2, may be identified. At least the fail addresses corresponding to the fail areas, for example, at least the first and second fail addresses FA1 and FA2 may be stored as the fail information FI in the fail address table 237. However, example embodiments are not limited thereto, for example, the fail areas may be identified after the manufacturing process.

Figure 6:
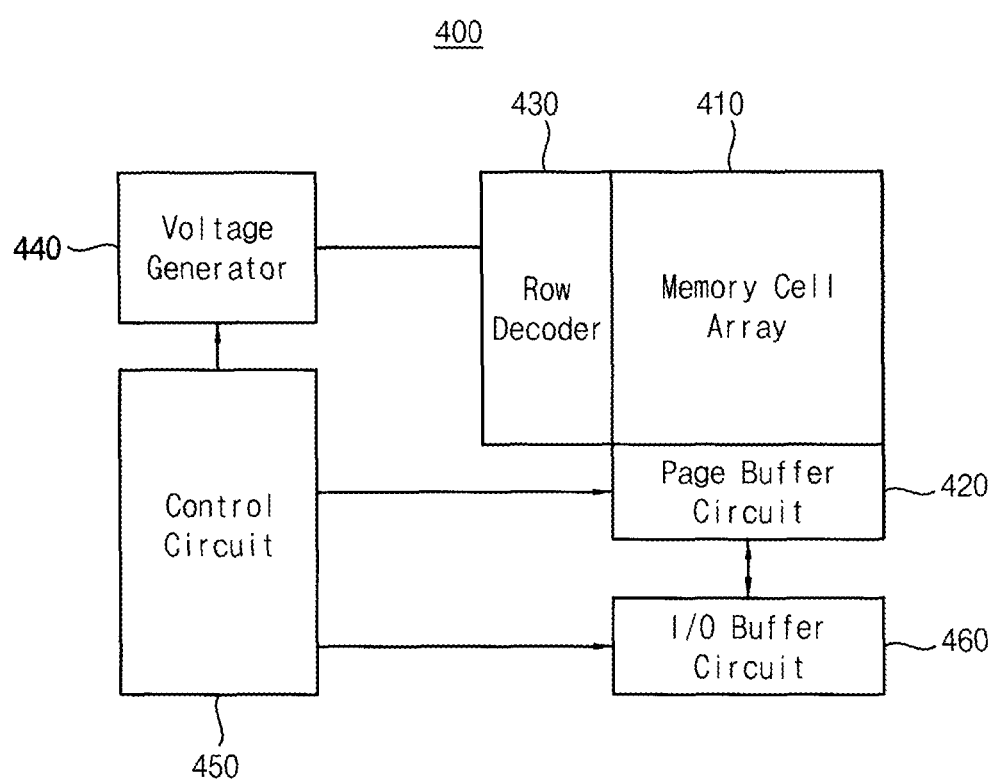
FIG. 6 is a block diagram illustrating the storage in FIG. 1 according to some example embodiments.

FIG. 6 is a block diagram illustrating the storage in FIG. 1 according to some example embodiments.

In FIG. 6, it is assumed that the storage 400 is implemented with a nonvolatile flash memory device, however, example embodiments are not limited thereto.

Referring to FIG. 6, the storage 400 may include a memory cell array 410, a page buffer circuit 420, a row decoder 430, a voltage generator 440, a control circuit 450 and an input/output (I/O) buffer circuit 460. The nonvolatile storage 400 may be implemented by flash memory device, PRAM, FRAM, RRAM, or MRAM, however, example embodiments are not limited thereto. The memory cell array 410 may include a plurality of memory cells connected to a plurality of word lines and a plurality of bit lines. As will be described below with reference to FIGS. 7 to 9, each of the memory cells may include a NAND, NOR flash memory cell or resistive memory cell, and the memory cells may be arranged in a two-dimensional array structure or a three-dimensional array structure.

In some example embodiments, each of the memory cells may include a single level memory cell (SLC) for storing one data bit and a multi-level memory cell (MLC) for storing a plurality data bits. In a case of the MLC, a program scheme in a write mode may include various program schemes such as a shadow program scheme, a reprogram scheme, or an on-chip buffered program scheme.

The page buffer circuit 420 is connected to the bit lines and is controlled by the control circuit 450 and serves as a sense amplifier or a write driver according an operation mode. For example, during a read operation, the page buffer circuit 420 may operate as the sense amplifier for sensing data from memory cells in a selected row. During a program operation, the page buffer circuit 420 may operate as a write driver for driving memory cells in a selected row according to program data. The page buffer circuit 420 may include page buffers corresponding to bit lines or bit line pairs, respectively. The I/O buffer circuit 460 receives write data from the storage controller 300 and transmits read data to the storage controller 300.

The row decoder 430 is connected to the word lines and may select at least one of the word lines in response to a row address. The voltage generator 440 may generate word line voltages such as a program voltage, a pass voltage, a verification voltage, an erase voltage and a read-out voltage according to a control of the control circuit 450. The control circuit 450 may control the page buffer circuit 420, the row decoder 430 and the voltage generator 440 in order to perform the data storing, erasing and read-out operations with respect to the memory cell array 410.

Figure 7:
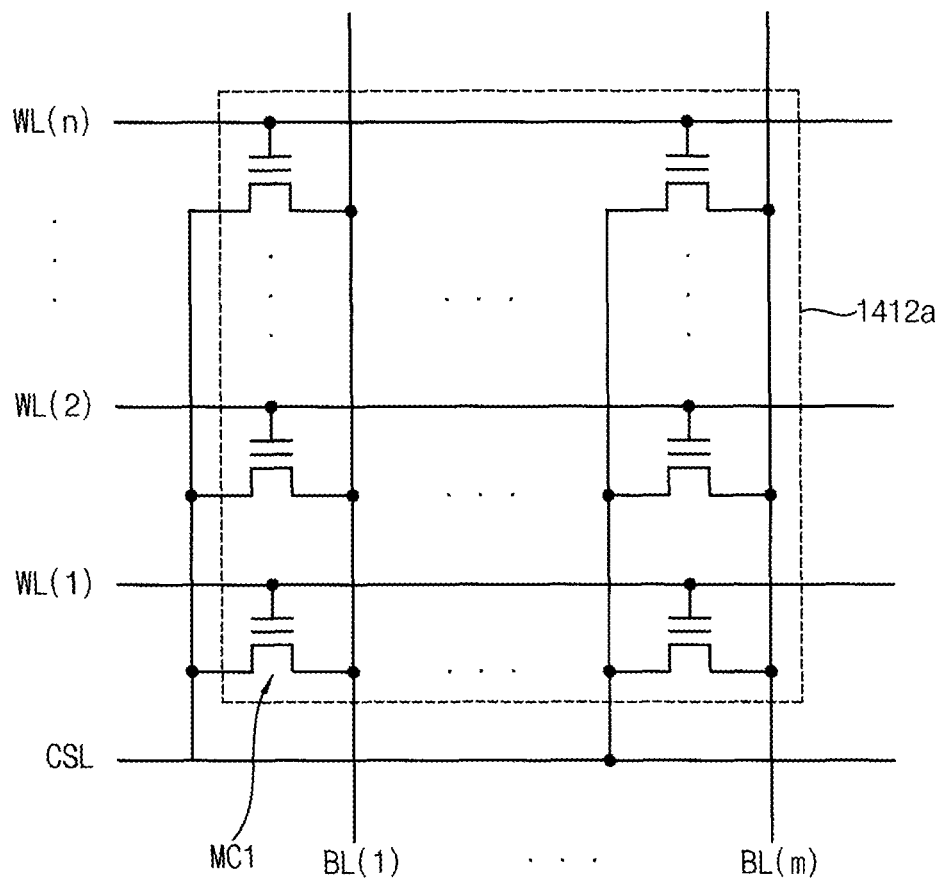
FIGS. 7 through 9 are diagrams illustrating examples of memory cell arrays that might be incorporated in the non-volatile storage of FIG. 6.
Figure 8:
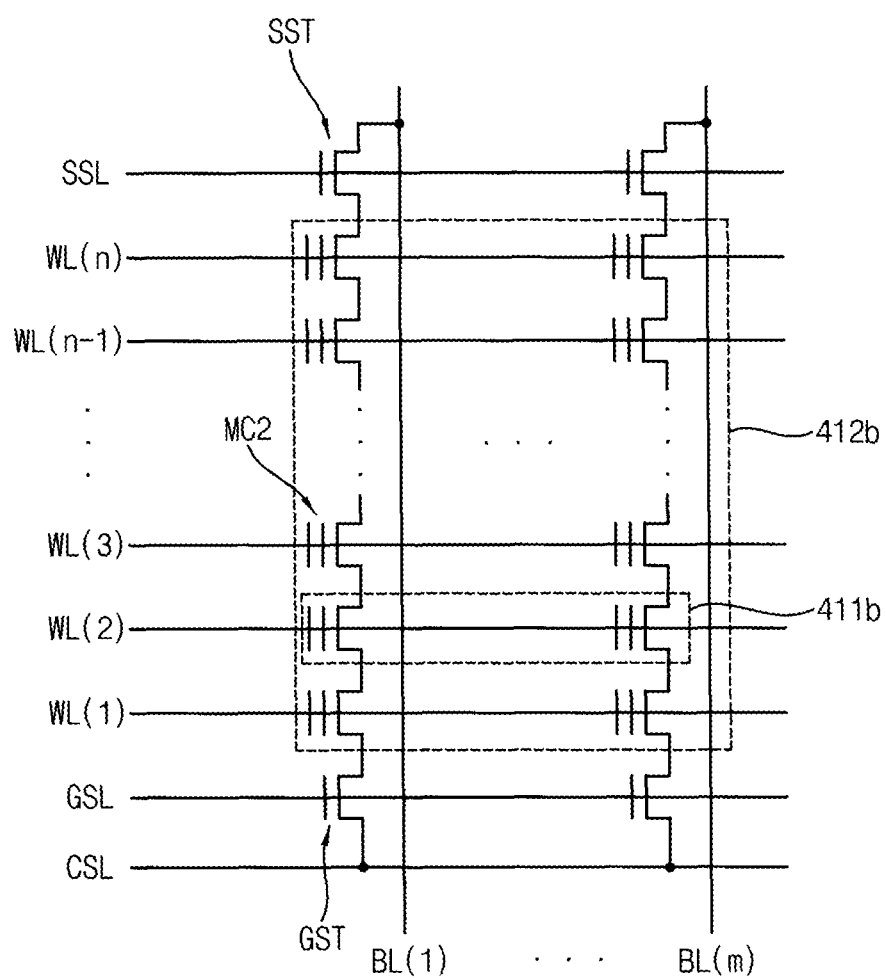
Figure 9:
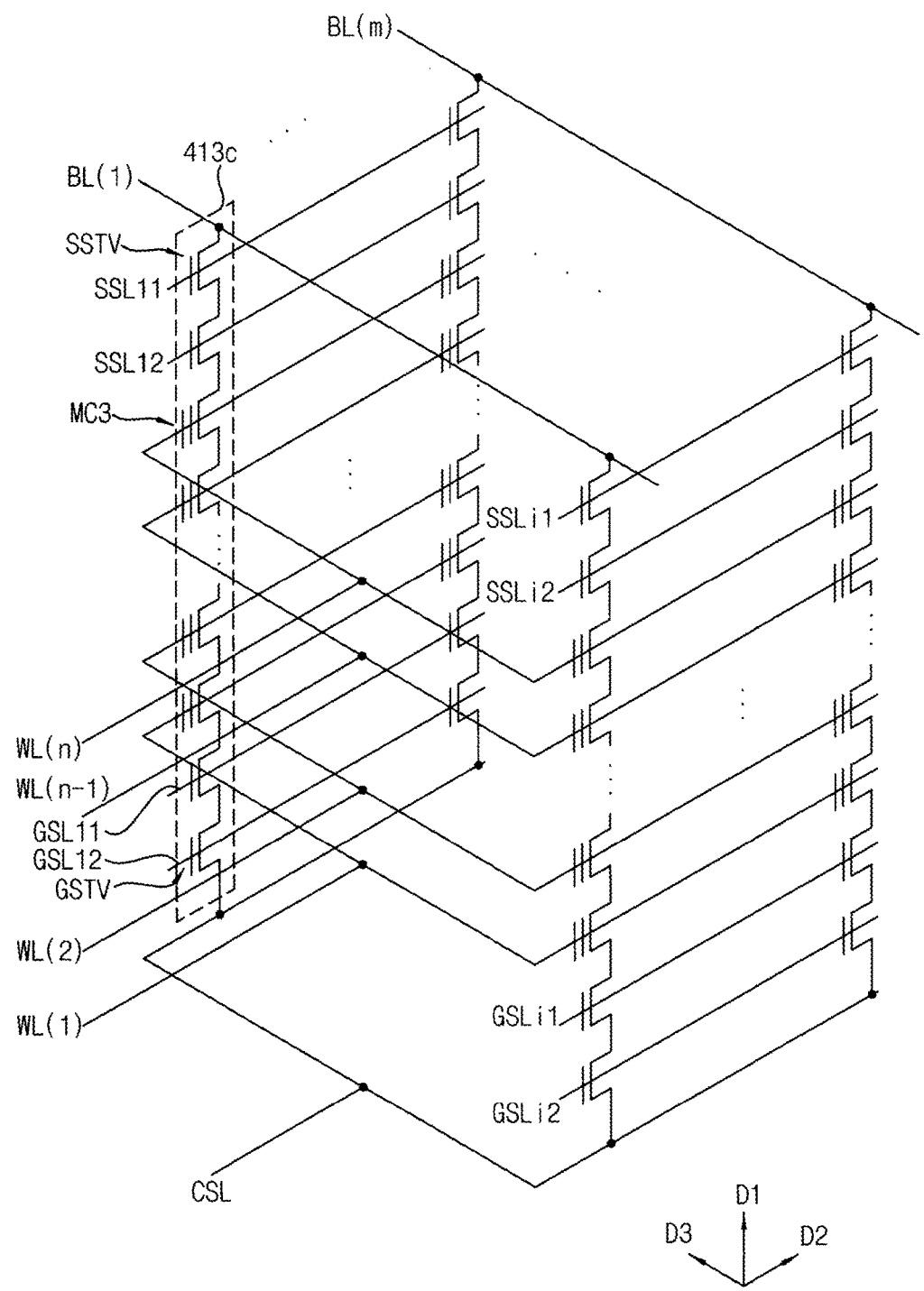

FIGS. 7 through 9 are diagrams illustrating examples of different memory cell arrays that may be included in the nonvolatile storage of FIG. 6 according to example embodiments.

FIG. 7 is a circuit diagram illustrating a memory cell array included in a NOR flash memory device. FIG. 8 is a circuit diagram illustrating a memory cell array included in a NAND flash memory device. FIG. 9 is a circuit diagram illustrating a memory cell array included in a vertical memory device.

Referring to FIG. 7, a memory cell array 410a may include a plurality of memory cells MC1. Memory cells MC1 in the same column may be connected in parallel between one of bit-lines BL(1), . . . , BL(m) and a common source line CSL. Memory cells in the same row may be commonly connected to the same word-line among word-lines WL(1), . . . , WL(n). For example, memory cells in a first column may be connected in parallel between a first bit-line BL(1) and the common source line CSL. Memory cells in a first row may be commonly connected to a first word-line WL(1). The memory cells MC1 may be controlled by a voltage on the word-lines WL(1), . . . , WL(n). In the NOR flash memory device of the memory cell array 410a, a read operation and a program operation may be performed per byte or word, and an erase operation may be performed per block 412a.

The boot image BI, the operating system OS and the application programs may be stored in some portions of the memory cell array 410a, and the boot image BI, the operating system OS and the application programs may be loaded to the safe area SA of the main memory 200 to be executed under control of the host device 100 during booting process of the computing system 10.

Referring to FIG. 8, a memory cell array 410b may include string select transistors SST, ground select transistors GST and a plurality of memory cells MC2. The string select transistors SST may be connected to bit-lines BL(1), . . . , BL(m), and the ground select transistors GST may be connected to a common source line CSL. The memory cells MC2 may be connected in series between the string select transistors SST and the ground select transistors GST. Memory cells in the same row may be connected to the same word-line among word-lines WL(1), . . . , WL(n). For example, 16, 32 or 64 word-lines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC2 may be controlled by a voltage on the word-lines WL(1), . . . , WL(n).

In the NAND flash memory device of the memory cell array 410b, a read operation and a program operation may be performed per page 411b, and an erase operation may be performed per block 412b. For example, the odd-numbered bit-lines may form odd-numbered pages, the even-numbered bit-lines may form even-numbered pages, and program operations for the odd-numbered pages and the even-numbered pages may be alternately performed.

The boot image BI, the operating system OS and the application programs may be stored in some portions of the memory cell array 410b, and the boot image BI, the operating system OS and the application programs may be loaded to the safe area SA of the main memory 200 to be executed under control of the host device 100 during booting process of the computing system 10.

Referring to FIG. 9, a memory cell array 410c may include a plurality of strings 413c that each have a vertical structure. The plurality of strings 413c may be formed in a second direction D2 to define a string column, and a plurality of string columns may be formed in a third direction D3 to define a string array. Each string may include string select transistors SSTV, ground select transistors GSTV, and a plurality of memory cells MC3 that are formed in a first direction D1 and are connected in series between the string select transistors SSTV and the ground select transistors GSTV.

The string select transistors SSTV may be connected to bit-lines BL(1), . . . , BL(m), and the ground select transistors GST may be connected to a common source line CSL. The string select transistors SSTV may be connected to string select lines SSL11, SSL12, . . . , SSLi1, SSLi2, and the ground select transistors GSTV may be connected to ground select lines GSL11, GSL12, . . . , GSLi1, GSLi2. The memory cells in the same layer may be connected to the same word-line among word-lines WL(1), WL(2), . . . WL(n−1), WL(n). Each string select line and each ground select line may extend in the second direction D2, and the string select lines SSL11, . . . , SSLi2 and the ground select lines GSL11, . . . , GSLi2 may be formed in the third direction D3. Each word-line may extend in the second direction D2, and the word-lines WL(1), . . . , WL(n) may be formed in the first direction D1 and the third direction D3. Each bit-line may extend in the third direction D3, and the bit-lines BL(1), . . . , BL(m) may be formed in the second direction D2. The memory cells MC3 may be controlled by a voltage on the word-lines WL(1), . . . , WL(n).

Similarly to the NAND flash memory device, in the vertical memory device of the memory cell array 410c, a read operation and a program operation may be performed per page, and an erase operation may be performed per block. The vertical memory device may be, for example, a vertical flash memory device, a vertical NAND memory device (VNAND) and a vertical NOR memory device.

Although not illustrated in FIG. 9, according to some example embodiments, two string select transistors included in a single string may be connected to a single string select line, and two ground select transistors included in the single string may be connected to a single ground select line. According to some example embodiments, the single string may include one string select transistor and one ground select transistor.

The boot image BI, the operating system OS and the application programs may be stored in some portions of the memory cell array 410c, and the boot image BI, the operating system OS and the application programs may be loaded to the safe area SA of the main memory 200 to be executed under control of the host device 100 during booting process of the computing system 10.

Figure 10:
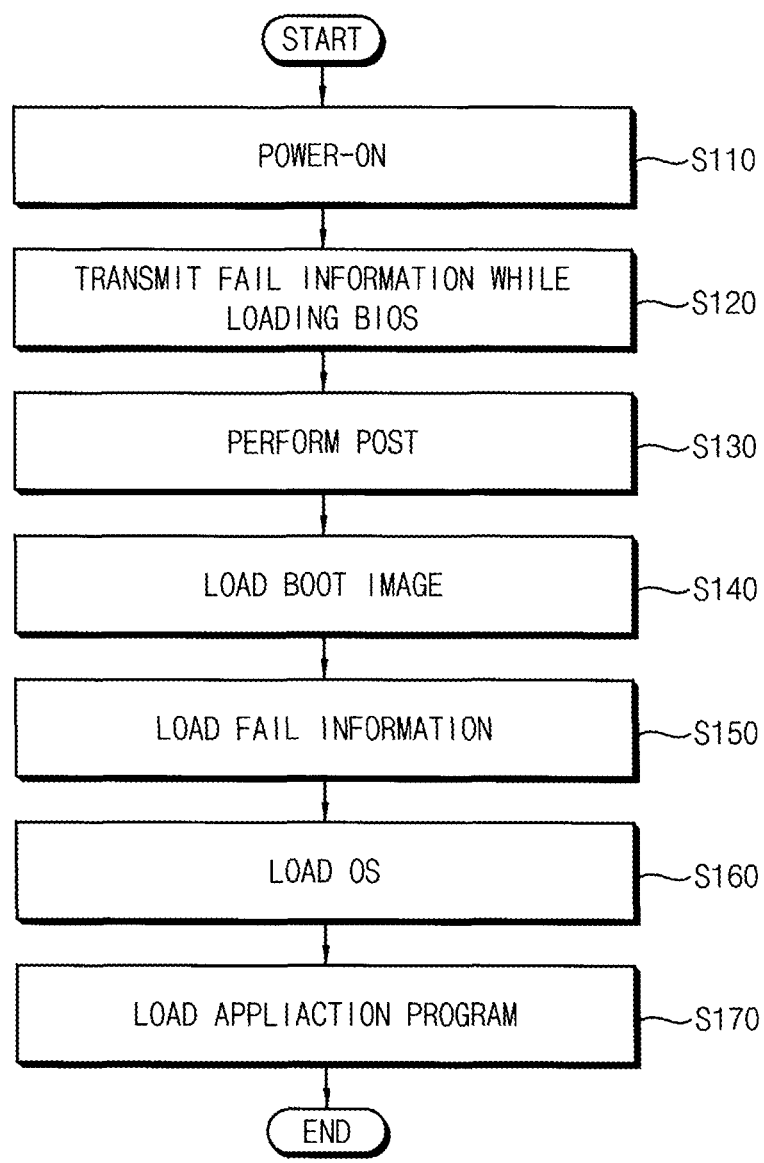
FIG. 10 is a flow chart illustrating a method of operating the computing system of FIG. 1.
Figure 11:
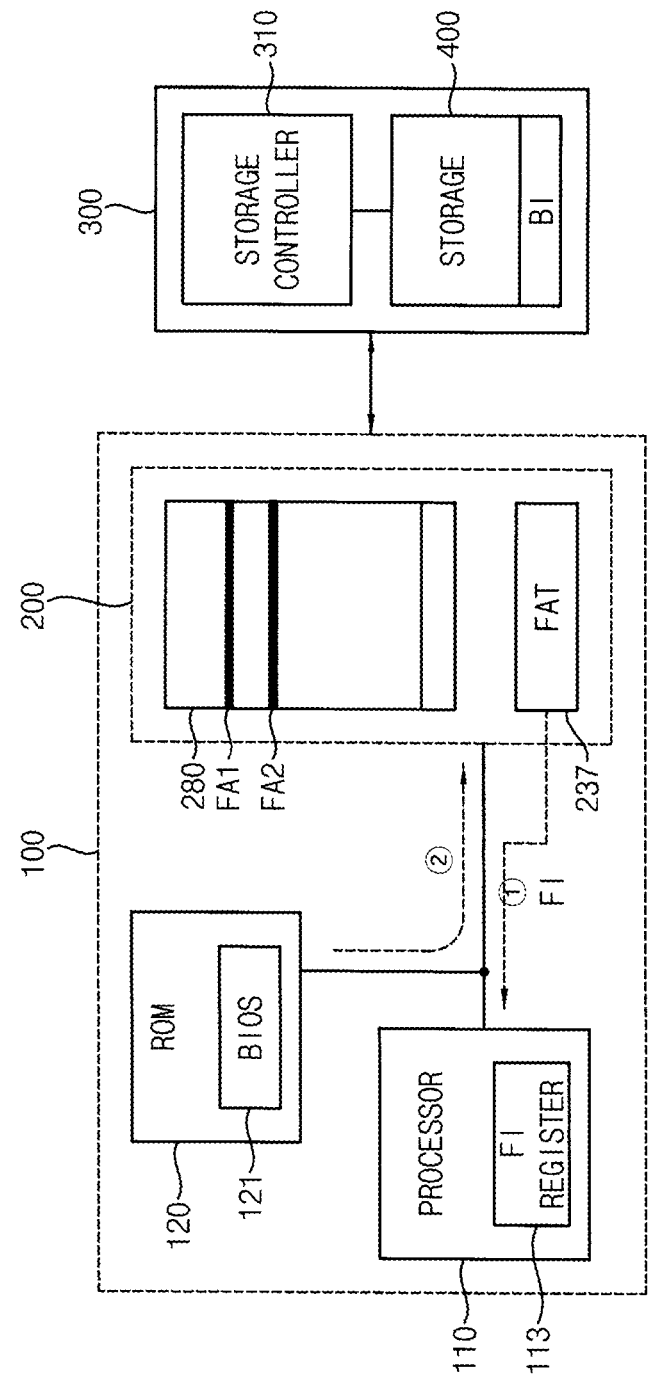
FIGS. 11 through 14 are diagrams for explaining that process of FIG. 10 is executed in the computing system of FIG. 1.

FIG. 10 is a flow chart illustrating a method of operating the computing system of FIG. 1 according to some example embodiments.

FIGS. 11 through 14 are diagrams illustrating the process of FIG. 10 being executed in the computing system of FIG. 1 according to some example embodiments.

In FIGS. 11 through 14, the processor 110 includes a fail information register 113.

Referring to FIGS. 1, and 10 through 14, in operation S110, power is supplied to the computing system 10 such that the computing system 10 supplies power to all of the processor 110, the ROM 120, the main memory 200 and the storage device 300.

In operation S120, when the power is supplied to the computing system 10, the processor 110 transfers the fail information FI stored in the fail address table 237 to the fail information register 113 as a reference numeral ① indicates, and loads the BIOS 121 stored in the ROM 120 to the main memory 200 as a reference numeral ② indicates.

In operation S130, the BIOS 121 loaded in the main memory 200 is executed by the processor 110 and the BIOS 121 performs the initializing operation of the computing system 10. In the initializing operation, the BIOS 121 executed by the processor 110 performs power-on self test (POST) on the main memory 200 and the storage device 300 to initialize the main memory 200 and the storage device 300 and checks whether the main memory 200 and the storage device 300 have malfunctions. When the POST on the main memory 200 and the storage device 300 is complete, the main memory 200 and the storage device 300 may be in an operable state.

After the POST on the main memory 200 and the storage device 300 is complete, the BIOS 212 may request the boot image BI from the storage device 300. In response to the request, the storage controller 310 may load the boot image BI stored in the storage 400 to the buffer 312. In this case, addresses corresponding to an area in which the boot image BI is stored may be stored in a desired (or, alternatively, a predetermined) area of the storage 400. That is, the processor 311 of the storage controller 120 may load the boot image BI to the buffer 312 using the addresses stored in the desired (or, alternatively, the predetermined) area of the storage 400.

The BIOS 121 may designate locations in the safe area of the main memory 200, to which the boot image BI and the fail information FI are to be loaded by referring to the fail information FI stored in the fail information register 113.

In operation S140, as a reference numeral ③ indicates, the processor 110 loads the boot image BI from the storage 400 in a safe area SA1 of the memory cell array 280 by avoiding the fail areas designated by the first and second fail addresses FA1 and FA2. The boot image BI loaded in the safe area SA1 of the memory cell array 280 is executed by the processor 110 as a boot loader BL.

In operation S150, after the boot image BI is loaded in the safe area SA1 of the memory cell array 280 by avoiding the fail areas, the processor 110 loads the fail information FI from the fail information register 113 to a safe area SA2 of the memory cell area 280 by avoiding the fail areas as a reference numeral ④ indicates. The processor 110 may assign the fail information to addresses of the safe area SA2 such that the safe area SA2 to which the fail information is loaded does not overlap with the safe area SA1 to which the boot image IN is loaded.

In operation S160, as a reference numeral ⑤ indicates, the processor 110 may execute the boot image BI loaded in the safe area SA1 of the memory cell array 280 as the boot loader BL. The boot loader BL may load the operating system OS stored in the storage 400 to a safe area SA3 of the memory cell area 280 by avoiding the fail areas, referring to the fail information FI loaded in the safe area SA2. The boot loader BL may assign the operating system OS to addresses of the safe area SA such that the safe area SA3 to which operating system OS to be loaded does not overlap with the safe area SA2 in which the fail information FI is loaded and the safe area SA1 in which the boot image BI is loaded.

When the operating system OS is loaded in the safe area SA3 and the operating system OS is executed by the processor 110, authority to control the storage device 300 may be handed over from the boot loader BL to the operating system OS.

In operation S170, as a reference numeral ⑥ indicates, after the operating system OS is loaded in the safe area SA3 and is executed by the processor 110, the operating system OS may load the application program APPLICATION stored in the storage 400 to a safe area SA4 of the memory cell area 280 by avoiding the fail areas, referring to the fail information FI loaded in the safe area SA2. The operating system OS may assign the application program APPLICATION addresses of the safe area SA such that the safe area SA4 to which application program APPLICATION to be loaded does not overlap with the safe area SA3 in which the operating system OS is loaded and the safe area SA2 in which the fail information FI is loaded. In addition, since the authority to control the storage device 300 may be handed over from the boot loader BL to the operating system OS, the safe area SA4 to which application program APPLICATION to be loaded may overlap with some or all of the safe area SA1 in which the boot loader BL is loaded.

As described with reference to FIGS. 1 and 10 through 14, in a method of operating the computing system according to some example embodiments, the fail information FI on the fail addresses of the main memory 200 is provided to the processor 110 during a power-on sequence when the power is supplied to the computing system 10. The processor 110 loads the boot image BI, the operating system OS and the application programs stored in the storage device 300 to safe areas SAs of the memory cell array 280 of the main memory 200 by avoiding the fail areas Fas designated by the fail addresses. Therefore, secure booting of the computing system 10 may be performed.

Figure 15:
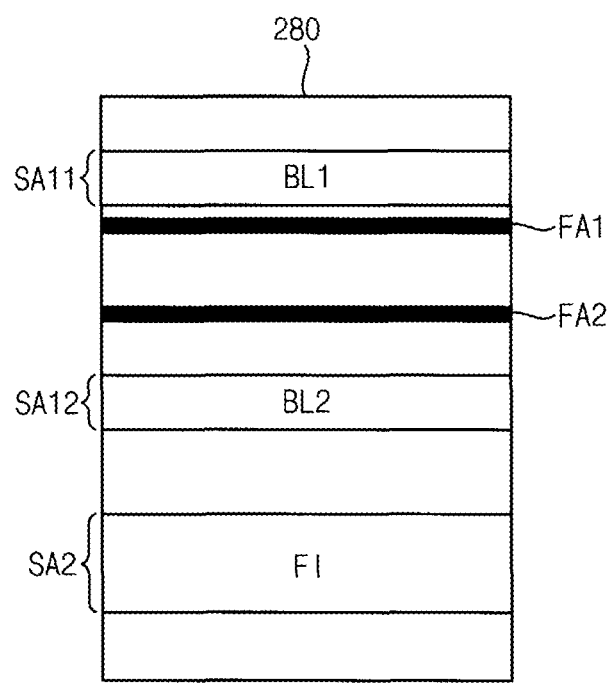
FIG. 15 illustrates that the boot image is loaded such that the boot image is dispersed in the safe area of the memory cell area.

FIG. 15 illustrates that the boot image may be loaded such that the boot image is dispersed in the safe area of the memory cell area.

Figure 12:
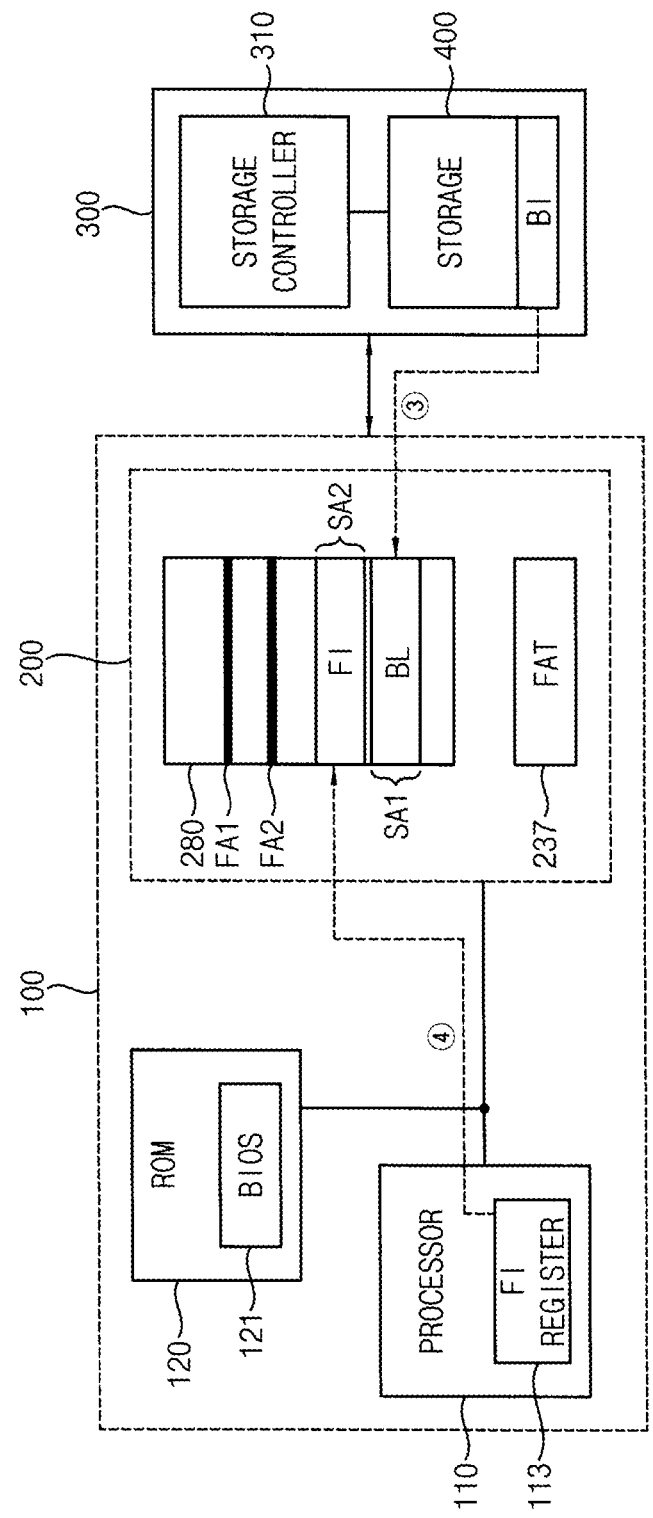
Figure 13:
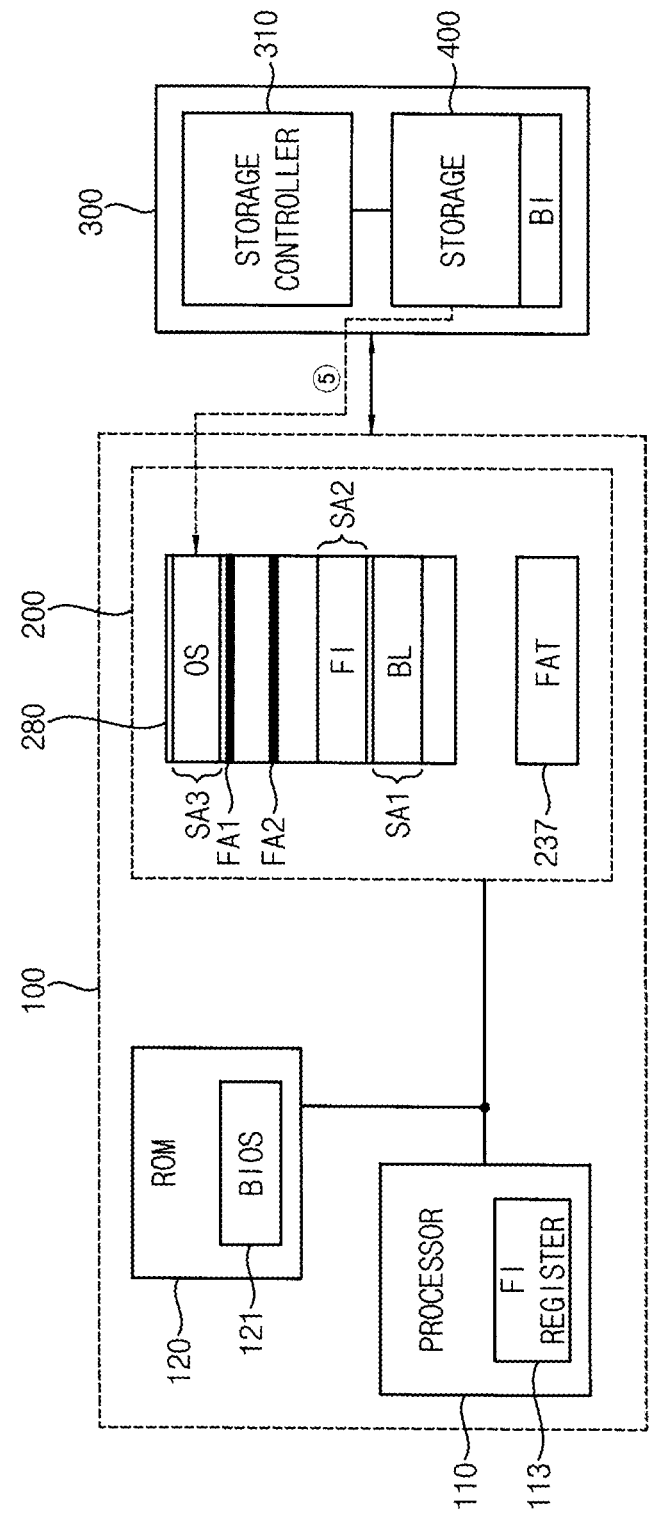
Figure 14:
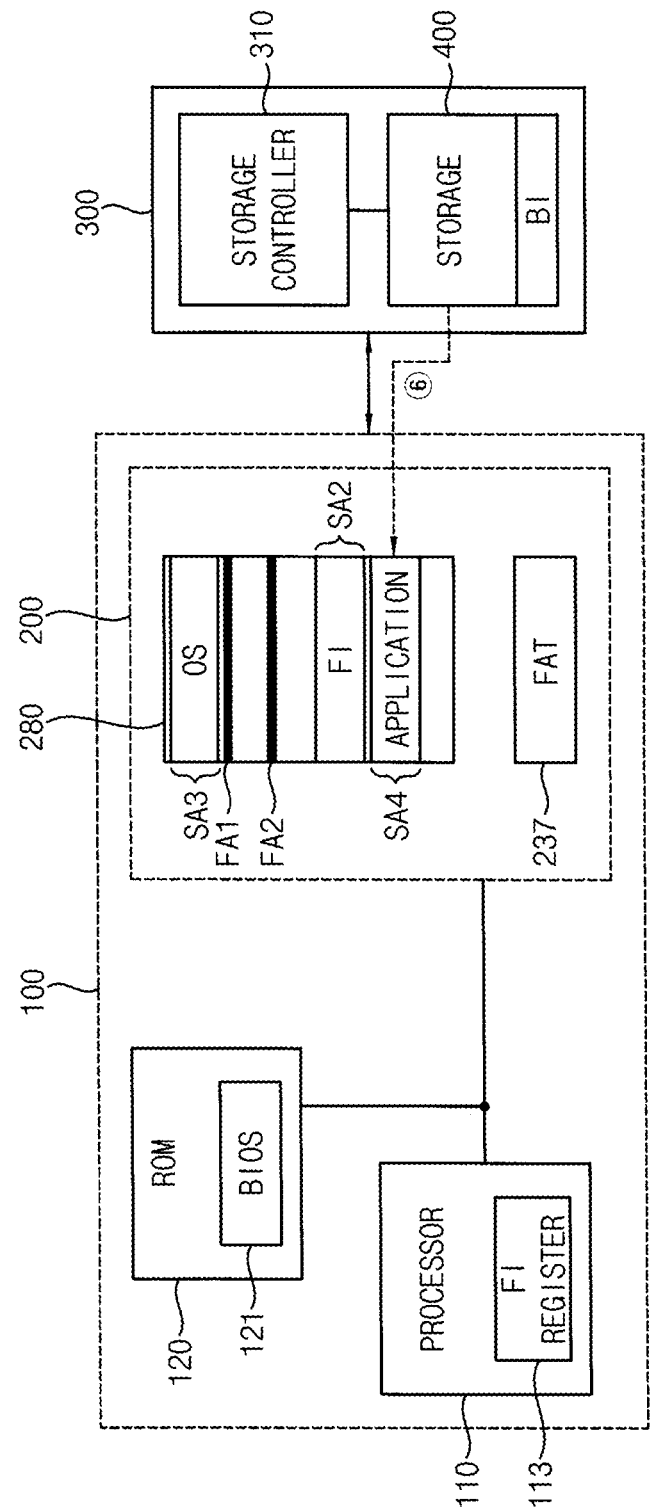

Referring to FIGS. 12 and 15, when the BIOS 121 loads the boot image BI to the safe area SA of the memory cell array 280, in some example embodiments, as illustrated in FIG. 12, the boot image BI may be loaded in the safe area SA1 that has consecutive physical addresses. In other example embodiments, as illustrated in FIG. 15, the boot image BI may be dispersedly loaded in safe areas SA11 and SA12 that have non-consecutive physical addresses. That is, a first portion BL1 of the boot loader BL is loaded in the safe area SA11 and a second portion BL2 of the boot loader BL is loaded in the safe area SA12. The distributed loading may be applicable to the operating system OS and the application program APPLICATION in addition to the boot image BI.

Referring to FIGS. 11 through 15, the processor 110 may adaptively load the data (or program) associated with booting operation of the computing system 10, such as the boot image BI, the operating system and/or application program to the safe area of the memory cell array 280 based on the fail information FI such that the data (or program) associated with booting operation of the computing system 10 have consecutive or non-consecutive physical addresses.

Figure 16:
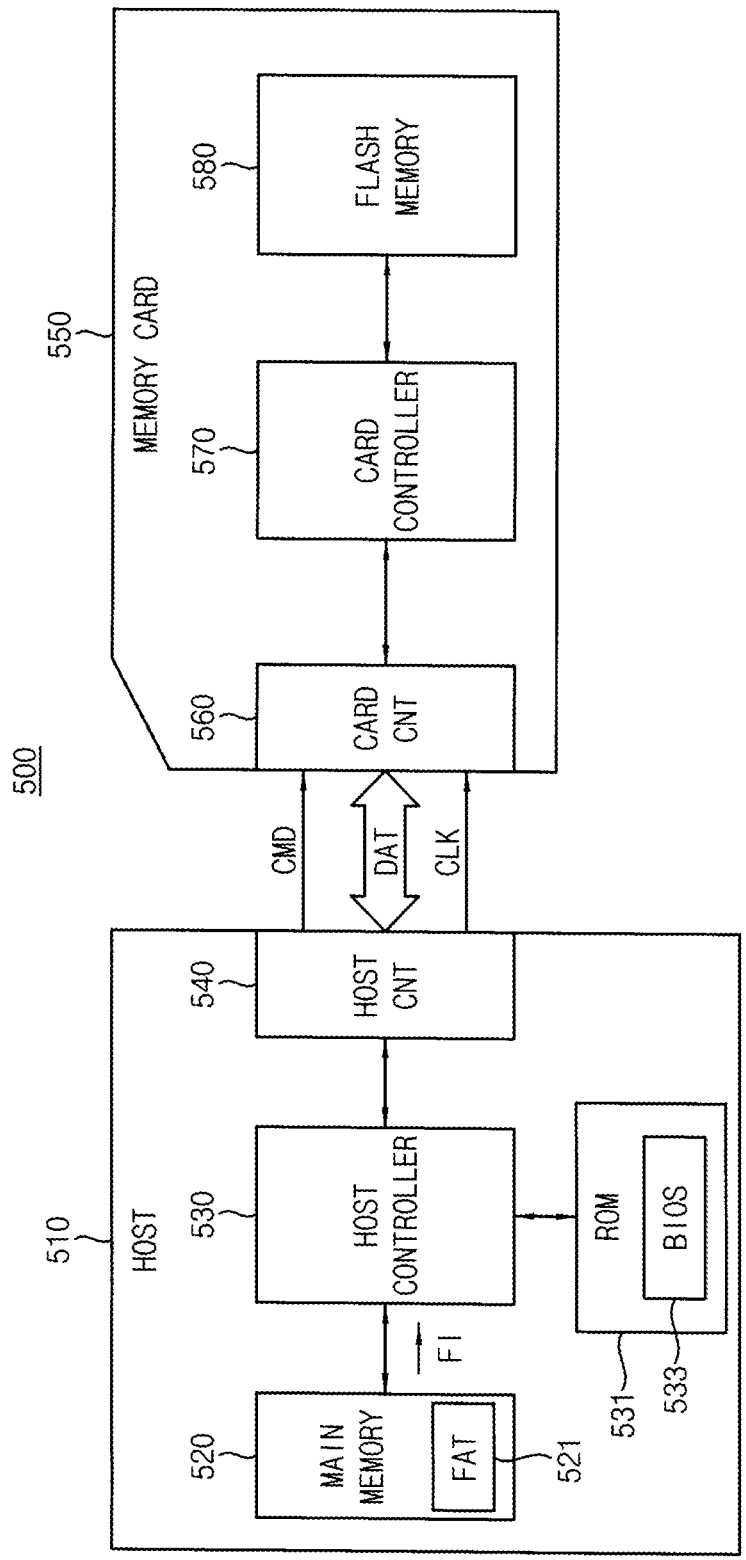
FIG. 16 is a block diagram illustrating a memory card system that employs a memory system according to some example embodiments.

FIG. 16 is a block diagram illustrating a memory card system that employs a memory system according to some example embodiments.

Referring to FIG. 16, a memory card system 500 includes a host device 510 and a memory card 550. The host device 510 may include a main memory 520 that has a fail address table 521, a host controller 530, a host connection unit 540 and a ROM 531 that stores a BIOS 533.

The host device 510 may write data in the memory card 550 and read data from the memory card 550. The host controller 530 may send a command (e.g., a write command) CMD, a clock signal CLK generated from a clock generator (not shown) in the host device 510, and data DAT to the memory card 550 via the host connection unit 540.

The memory card 550 may include a card connection unit 560, a card controller 570, and a flash memory 580. The card controller 570 may store data in the flash memory 580 in response to a command input via the card connection unit 560. The data may be stored in synchronization with a clock signal generated from a clock generator (not shown) in the card controller 570. The flash memory 580 may store data transferred from the host device 510. For example, in a case where the host device 510 is a digital camera, the flash memory 580 may store image data.

In the memory card system 500 of FIG. 16, the fail information FI on the fail addresses of the main memory 520 is provided to the host controller 530 during a power-on sequence when the power is supplied to the memory card system 500. The host controller 530 may load the boot image, the operating system and the application programs stored in the flash memory 580 to a safe area SA of the memory cell array of the main memory 520 by avoiding the fail areas designated by the fail addresses. Therefore, secure booting of the memory card system 500 may be performed.

Figure 17:
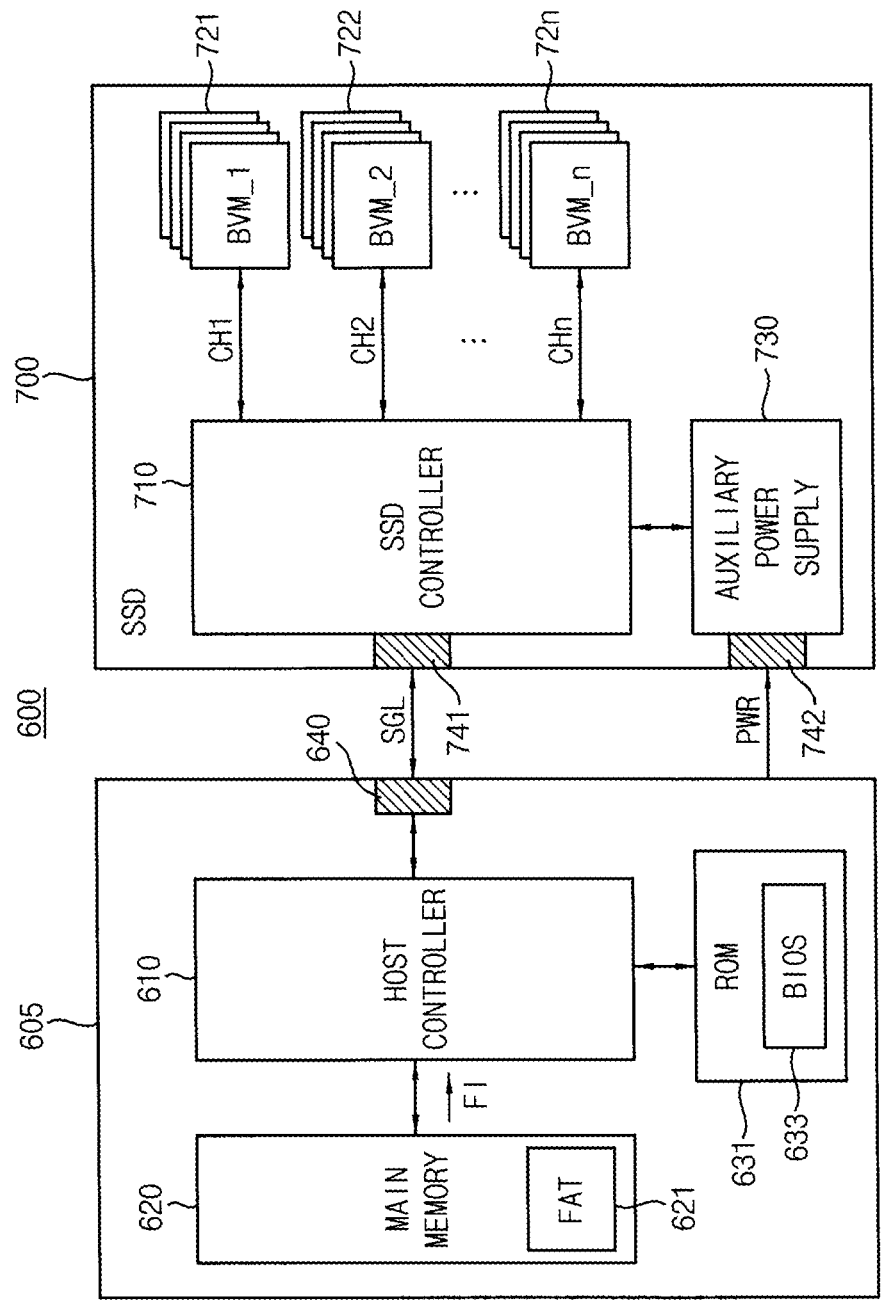
FIG. 17 is a block diagram illustrating a solid state drive system that employs a memory system according to some example embodiments.

FIG. 17 is a block diagram illustrating a solid state drive system that employs a memory system according to some example embodiments.

Referring to FIG. 17, a solid state drive (SSD) system 600 includes a host device 605 and a SSD 700. The host device 605 may include a host interface 640, a main memory 620 that has a fail address table 621, a host controller 610, and a ROM 631 that stores a BIOS 633.

The host 605 may write data in the SSD 700 or read data from the SSD 700. The host controller 610 may transfer signals SGL such as a command, an address, a control signal, and the like to the SSD 700 via the host interface 640.

The SSD 700 may exchange signals SGL with the host device 605 via a host interface 741, and may be supplied with a power via a power connector 742. The SSD 700 may include a plurality of nonvolatile memories 72*l* through 72*n*, an SSD controller 710, and an auxiliary power supply 730. Herein, the nonvolatile memories 72*l* through 72*n* may be implemented by not only a NAND flash memory but also PRAM, MRAM, ReRAM, and the like.

The plurality of nonvolatile memories 72*l* through 72*n* may be used as a storage medium of the SSD 700. The plurality of nonvolatile memories 72*l* through 72*n* may be connected with the SSD controller 710 via a plurality of channels CH1 to CHn. One channel may be connected with one or more nonvolatile memories. Nonvolatile memories connected with one channel may be connected with the same data bus.

The SSD controller 710 may exchange signals SGL with the host device 605 via the host interface 741. The signals SGL may include a command, an address, data, and the like. The SSD controller 710 may be configured to write or read out data to or from a corresponding nonvolatile memory according to a command of the host device 605.

The auxiliary power supply 730 may be connected with the host device 605 via the power connector 742. The auxiliary power supply 730 may be charged by a power PWR from the host device 605. The auxiliary power supply 730 may be placed within the SSD 700 or outside the SSD 700. For example, the auxiliary power supply 730 may be put on a main board to supply an auxiliary power to the SSD 700.

In the SSD system 600 of FIG. 17, the fail information FI on the fail addresses of the main memory 620 may be provided to the host controller 610 during a power-on sequence when the power is supplied to the SSD system 600. The host controller 610 may load the boot image, the operating system and the application programs stored in the nonvolatile memories 72*l* through 72*n* to a safe area SA of the memory cell area of the main memory 620 by avoiding the fail areas designated by the fail addresses. Therefore, secure booting of the SSD system 600 may be performed.

Figure 18:
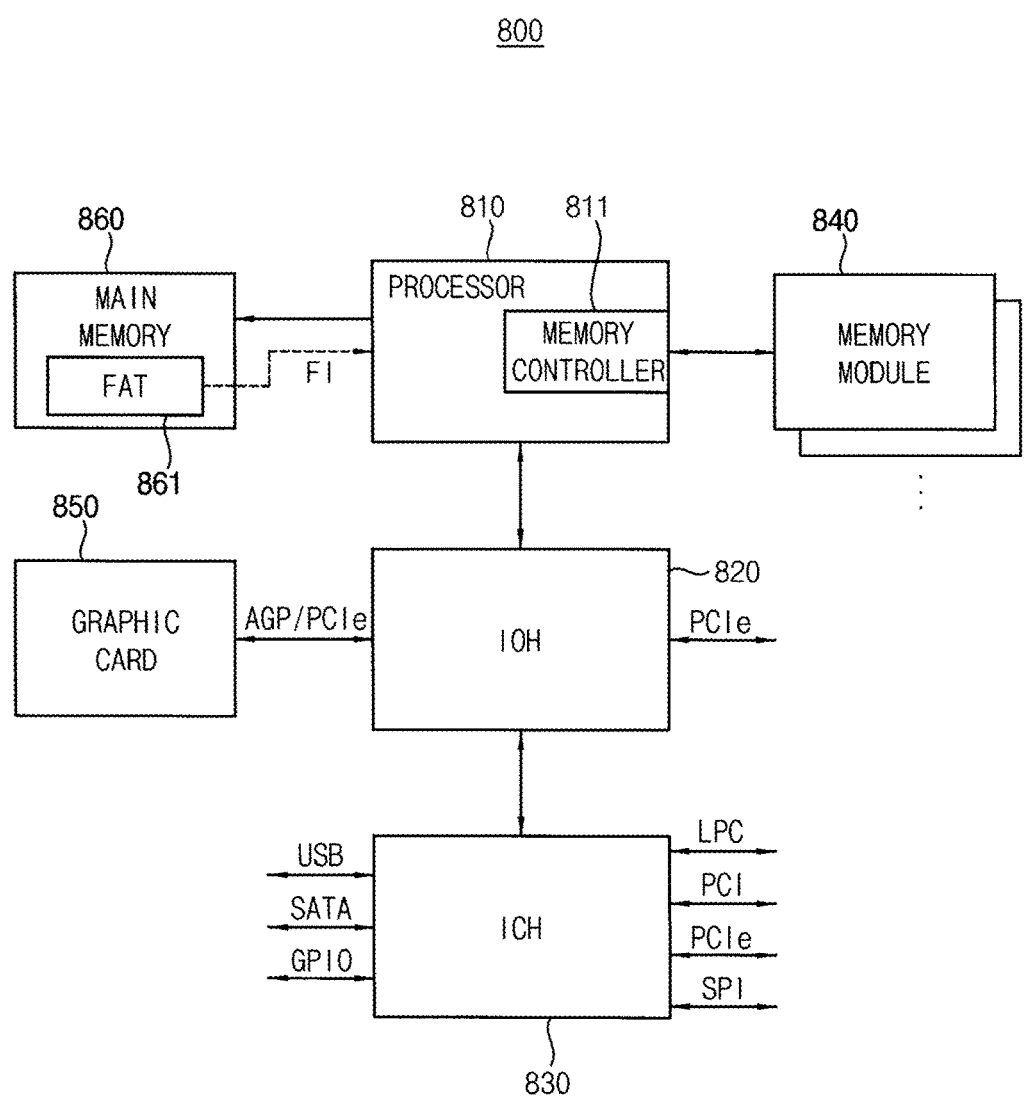
FIGS. 18 and 19 are block diagrams illustrating a computing system that may incorporate a storage device according to some example embodiments.
Figure 19:
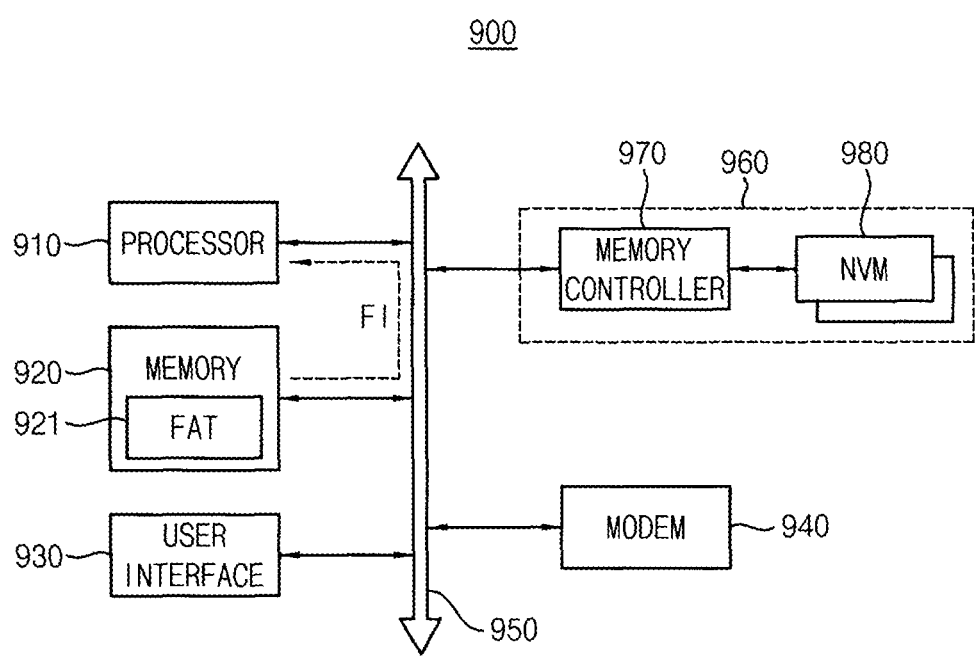

FIGS. 18 and 19 are block diagrams illustrating a computing system that may incorporate a storage device according to some example embodiments.

Referring to FIG. 18, a computing system 800 may include a processor 810, an I/O hub 820, an I/O controller hub 830, at least one memory module 840, a graphic card 850 and a main memory 860 that stores a fail address table 861. The fail address table 861 stores fail addresses designating a memory cell row that includes defective cells or weak cells in a memory cell area of the main memory 860 as a fail information FI. According to some example embodiments, the computing system 800 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The processor 810 may perform specific calculations or tasks. For example, the processor 810 may be a microprocessor, a central process unit (CPU), a digital signal processor, or the like. The processor 810 may include a single processor core or a plurality of processor cores. The processor 810 may be a multi-core processor, such as a dual-core processor, a quad-core processor, a hexa-core processor, etc. In some example embodiments, the computing system 800 may include one processor 810, however, in other example embodiments, the computing system 800 may include a plurality of processors. In some example embodiments, the processor 810 may further include a cache memory located inside or outside the processor 810.

The processor 810 may include a memory controller (not illustrated) that controls an operation of the memory module 840. The memory controller 811 included in the processor 810 may be referred to as an integrated memory controller (IMC). A memory interface between the memory controller and the memory module 840 may be implemented by one channel including a plurality of signal lines, or by a plurality of channels. Each channel may be coupled to at least one memory module 840. The memory controller 811 may be included in the I/O hub 820. The I/O hub 820 including the memory controller may be referred to as a memory controller hub (MCH).

The memory module 840 may include a plurality of nonvolatile memory devices that store data provided from the memory controller 811. The nonvolatile memory devices of the memory module 840 may include a boot image, an operating system and application programs. The fail information FI on the fail addresses of the main memory 860 may be provided to the processor 810 during a power-on sequence when the power is supplied to the computing system 800. The processor 810 may load the boot image, the operating system and the application programs stored in the nonvolatile memory devices of the memory module 840 to a safe area of the memory cell array of the main memory 860 by avoiding the fail areas designated by the fail addresses. Therefore, secure booting of the computing system 800 may be performed.

The I/O hub (IOH) 820 may manage data transfer between the processor 810 and devices, such as the graphic card 850. The I/O hub 820 may be coupled to the processor 810 via at least one of various interfaces, such as a front side bus (FSB), a system bus, a HyperTransport, a lightning data transport (LDT), a QuickPath interconnect (QPI), a common system interface (CSI), etc. In some example embodiments, the computing system 800 may include one I/O hub 820, however, in other example embodiments, the computing system 800 may include a plurality of I/O hubs.

The I/O hub 820 may provide various interfaces with the devices. For example, the I/O hub 820 may provide an accelerated graphics port (AGP) interface, a peripheral component interface-express (PCIe), a communications streaming architecture (CSA) interface, etc.

The graphic card 850 may be coupled to the I/O hub 820 via the AGP or the PCIe. The graphic card 850 may control a display device (not illustrated) for displaying an image. The graphic card 850 may include an internal processor and an internal memory to process the image. In some example embodiments, the input/output hub 820 may include an internal graphic device along with or instead of the graphic card 850. The internal graphic device may be referred to as an integrated graphics, and an I/O hub including the memory controller and the internal graphic device may be referred to as a graphics and memory controller hub (GMCH).

The I/O controller hub 830 may perform data buffering and interface arbitration to efficiently operate various system interfaces. The I/O controller hub 830 may be coupled to the I/O hub 820 via an internal bus. For example, the I/O controller hub 830 may be coupled to the I/O hub 820 via at least one of various interfaces, such as a direct media interface (DMI), a hub interface, an enterprise Southbridge interface (ESI), PCIe, etc.

The I/O controller hub 830 may provide various interfaces with peripheral devices. For example, the I/O controller hub 830 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In some example embodiments, the processor 810, the I/O hub 820 and the I/O controller hub 830 may be implemented as separate chipsets or separate integrated circuits. In other example embodiments, at least two of the processor 810, the I/O hub 820 and the I/O controller hub 830 may be implemented as one chipset.

Referring to FIG. 19, a computing system 900 may include a processor 910, a main memory 920 that has a fail address table 921, a user interface 930, a modem 940, a bus 950 and a memory system 960. The memory system 960 may include a memory controller 970 and a nonvolatile memory device 980.

The processor 910 may execute applications, such as an internet browser, a game application, a video player application, etc. The processor 910 may include a single processor core or a plurality of processor cores. For example, the processor 910 may be a multi-core processor, such as a dual-core processor, a quad-core processor, a hexa-core processor, etc. The processor 910 may further include a cache memory (not shown) located inside or outside the processor 910. The processor 910 may be coupled to the memory system 960 and the main memory 920 through the bus 950. The bus 950 may be an address bus, a control bus and/or a data bus. The modem 940 wirelessly receives or transmits data with an external device. The memory device 920 may be implemented by a DRAM, a SRAM, a mobile DRAM, or the like. The memory device 920 may store an instruction/data processed by the processor 910, or store data received via the modem 940 through the memory controller 970.

The nonvolatile memory device 980 may include a boot image, an operating system and application programs. Therefore, in the computing system 900, the fail information FI on the fail addresses of the main memory 920 is provided to the processor 910 during a power-on sequence when the power is supplied to the computing system 900. The processor 910 may load the boot image, the operating system and the application programs stored in the nonvolatile memory devices 980 to a safe area of the memory cell array of the main memory 920 by avoiding the fail areas designated by the fail addresses. Therefore, secure booting of the computing system 900 may be performed.

The computing system 900 may further include a power supply that provides operating voltage. The computing system 900 may further include an application chipset and a camera image processor.

As mentioned above, according to some example embodiments, the fail information on the fail addresses of the main memory is provided to the processor during a power-on sequence when the power is supplied to the computing system, and the processor loads the boot image, the operating system and the application programs stored in storage to a safe area of the main memory by avoiding the fail areas designated by the fail addresses. Therefore, secure booting of the computing system may be performed.

As illustrated in FIGS. 2 and 3, the memory system 100 and the storage 300 may include processors 110 and 311, respectively and memory 120 and 312, respectively.

The processors 110 and 311 may be arithmetic logic units, digital signal processors, microcomputers, field programmable arrays, programmable logic units, microprocessors or any other device capable of responding to and executing instructions in a defined manner such that the processors 110 and 311 are programmed with instructions that configure the processors 110 and 311 as special purpose computers to perform the operations illustrated in FIG. 10.

The instructions may be stored on a non-transitory computer readable medium. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. The non-transitory computer-readable media may also be a distributed network, so that the program instructions are stored and executed in a distributed fashion.

The example embodiments are applicable to a non-volatile memory device and various apparatuses and systems using the same. Therefore, the example embodiments may be used in any device or system including a nonvolatile memory device, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible to the example embodiments without materially departing from the scope thereof as set forth in the accompanying claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the claims.

What is claimed is:

1. A memory device, comprising:
 a read-only memory (ROM) configured to store a basic input/output system (BIOS) therein;

a main memory configured to store a fail address table therein, the fail address table configured to store at least one fail address therein, the fail address designating a memory cell row having at least one defective cell; and a processor coupled to the ROM and the main memory, the processor configured to,
  receive fail information of the at least one fail address from the fail address table, and
  load, from a storage device, data associated with a booting operation of the memory device into a safe area of the main memory by,
    loading the BIOS from the ROM to the safe area of the main memory based on the fail information such that the processor avoids loading the data in a fail area of the main memory corresponding to the at least one fail address,
    executing the loaded BIOS, and
    performing a power-on self-test (POST) on the memory device and the storage device using the BIOS.

2. The memory device of claim 1, wherein the booting operation occurs when power is applied to the memory device, and
  the processor is configured to execute the loaded BIOS during the booting operation such that the executed BIOS performs an initializing operation of the memory device.

3. The memory device of claim 1, wherein the data associated with the booting operation includes at least a boot image that is loaded from the storage device, and
  the BIOS is configured to designate locations in the safe area, to which the boot image and the fail information are loaded by referring to the fail information.

4. The memory device of claim 3, wherein the processor includes a fail information register, the fail information register configured to store the fail information therein.

5. The memory device of claim 3, wherein after the boot image is loaded into the safe area of the main memory from the storage device, the processor is configured to load the fail information to the designated locations in the safe area.

6. The memory device of claim 5, wherein the processor is configured to assign the fail information to addresses of the safe area of the main memory such that the fail information in the safe area does not overlap with the boot image in the safe area.

7. The memory device of claim 5, wherein the processor is configured to execute the boot image loaded in the safe area as a boot loader, and
  the boot loader is configured to load an operating system stored in the storage device to the safe area of the main memory by referring to the fail information.

8. The memory device of claim 7, wherein the processor is configured to assign the operating system to the addresses of the safe area of the main memory such that the operating system in the safe area does not overlap with the boot loader and the fail information in the safe area.

9. The memory device of claim 7, wherein the processor is configured to execute the operating system loaded in the safe area,
  the executed operating system is configured to,
    load an application program stored in the storage device to the safe area by referring to the fail information, and
    assign the application program to the addresses of the safe area such that the application program in the safe area does not overlap with the fail information and the OS in the safe area.

10. The memory device of claim 1, wherein the fail address table is non-volatile and the fail information is provided to the processor through a data pin of the main memory.

11. The memory device of claim 1, wherein the processor is configured to adaptively load the data associated with booting operation to the safe area of the main memory such that the data associated with the booting operation has consecutive addresses or non-consecutive addresses according to the fail information.

12. The memory device of claim 1, wherein the at least one fail address is stored in the fail address table after memory cells of the main memory are tested at a wafer level or a package level of the memory device.

13. A computing system comprising:
  a storage device configured to store at least a boot image, an operating system and an application program in storage therein; and
  a memory device configured to control the storage device, the memory device including,
    a read-only memory (ROM) configured to store a basic input/output system (BIOS) therein;
    a main memory configured to store a fail address table therein, the fail address table configured to store at least one fail address therein, the fail address designating a memory cell row having at least one defective cell; and
    a processor coupled to the ROM and the main memory, the processor configured to,
      receive fail information of the at least one fail address from the main memory, and
      load, from the storage device, data associated with a booting operation of the memory device into a safe area of the main memory by,
        loading the BIOS from the ROM to the safe area of the main memory based on the fail information such that the processor avoids loading the data in a fail area of the main memory corresponding to the at least one fail address,
        executing the loaded BIOS, and
        performing a power-on self-test (POST) on the memory device and the storage device using the BIOS.

14. The computing system of claim 13, wherein the main memory, is a DRAM and the storage device includes a storage controller and one of a NAND memory device, a NOR memory device, a VNAND memory device and a VNOR memory device.

15. A memory device comprising:
  a memory cell array;
  a read-only memory (ROM) configured to store a system Basic Input/Output System (BIOS) therein; and
  a processor configured to load machine executable code to one or more safe areas of the memory cell array based on fail information by,
    loading the BIOS from the ROM to one or more of the safe areas of the memory cell array based on the fail information when the memory device is initialized, and
    perform a power-on self-test (POST) on the memory device and a storage device using the BIOS when the memory device is initialized.

16. The memory device of claim 15, wherein the processor is configured to,
  acquire the fail information from a fail address table stored in the memory cell array, the fail information containing physical addresses of the memory cell array that are weak or damaged, and
  adaptively load the machine executable code to the one or more safe areas of the main memory such that the machine executable code is loaded in memory cells having consecutive or non-consecutive addresses according to the fail information.

17. The memory device of claim 16, wherein the memory cell array is configured to have the fail address table loaded with the fail information during fabrication of the memory device.

18. The memory device of claim 15, wherein the machine executable code is associated with one or more of a boot image, an operation system, and an application loaded during initialization of the memory device, and
   when loading the machine executable code during the initialization of the memory device, the processor is configured to load the machine executable code to memory cells of the safe area having logical addresses that are loaded in logically distinct ones of the safe areas.

* * * * *